(12) United States Patent
Hernandez et al.

(10) Patent No.: US 6,741,953 B2
(45) Date of Patent: May 25, 2004

(54) ACQUISITION UNIT AND METHOD FOR INFREQUENT CAPTURING OF DATA SAMPLES WITH ASSOCIATED TIMING INFORMATION

(75) Inventors: Adrian M. Hernandez, Colorado Springs, CO (US); John David Hansen, Colorado Springs, CO (US); John J. Sinnott, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 100 days.

(21) Appl. No.: 10/119,481

(22) Filed: Apr. 10, 2002

(65) Prior Publication Data

US 2003/0195721 A1 Oct. 16, 2003

(51) Int. Cl.[7] .............. G06F 15/00; G06F 7/02; H04J 1/16
(52) U.S. Cl. ............. 702/187; 702/66; 714/46
(58) Field of Search ............... 702/186, 187, 702/66, 71; 324/76.12; 709/224; 711/137; 714/13, 43, 46, 47, 38

(56) References Cited

U.S. PATENT DOCUMENTS

| 4,949,252 A | * | 8/1990 | Hauge ............... 714/46 |
| 5,682,328 A | * | 10/1997 | Roeber et al. ............... 702/187 |
| 6,529,842 B1 | * | 3/2003 | Williams et al. ............... 702/66 |

* cited by examiner

Primary Examiner—Kamini Shah
Assistant Examiner—John Le
(74) Attorney, Agent, or Firm—Kyle J. Way (57) ABSTRACT

A data acquisition circuit and method according to embodiments of the invention insert overflow states into a data storage unit among samples of input data and associated time tags that are of interest. The overflow states allow multiple overflows of the time tags without intervening samples of input data being stored, thus allowing the infrequent capture of samples of the input data while maintaining accurate timing data. Also, the overflow states obviate the need to store an overflow status flag with each stored sample of input data and time tag in the data storage unit.

15 Claims, 5 Drawing Sheets

ACQUISITION UNIT AND METHOD FOR INFREQUENT CAPTURING OF DATA SAMPLES WITH ASSOCIATED TIMING INFORMATION

BACKGROUND OF THE INVENTION

Logic analyzers and similar electronics devices employ some means of capturing input data, associating each sample of input data captured with a form of timing information so that the user of the device is provided with some indication as to when each data sample occurred. This timing information is generated typically by a digital counter that counts up to some maximum value before automatically starting again at zero, and then continuing the counting process.

Figure 1:
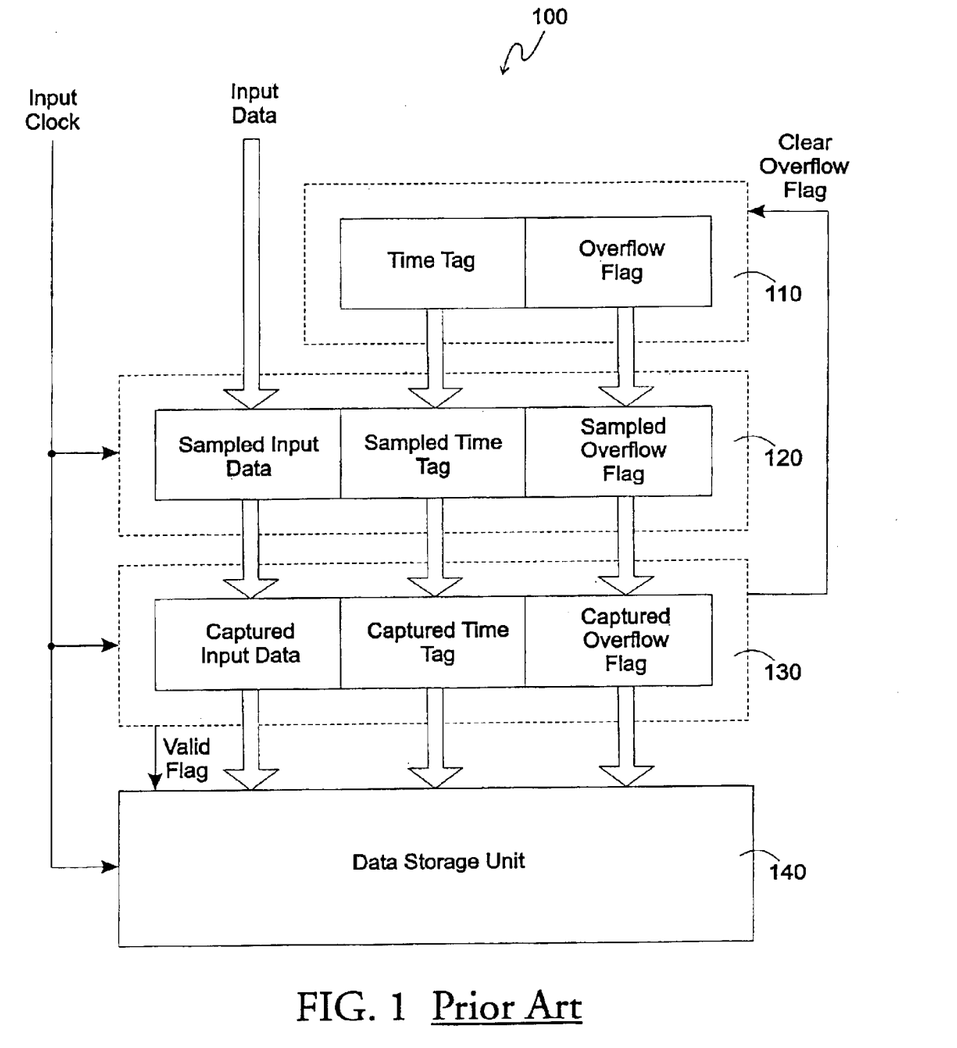
FIG. 1 is a block diagram of a data acquisition unit from the prior art.

FIG. 1 shows a typical data acquisition unit 100 of a logic analyzer from the prior art. A time tag generator 110, normally containing a digital counter as that mentioned above, generates a series of time tags that increase in value up to a maximum value before returning to zero. Also produced with each time tag is an overflow flag, which indicates when the counter has attained that maximum value and is restarting the count from zero.

The time tags and overflow flags are sampled by a data sampler 120, along with the current value of the input data to be captured, at the time a pulse on an associated input clock occurs. Normally, the data sampler 120 consists of enough simple memory latches or D-type flip-flops to store a single sample each of the input data, time tag and overflow flag.

A data filter 130 then examines each data sample from the data sampler 120 to determine if that data sample should be captured and stored for later use. Generally speaking, the user of the logic analyzer sets a predetermined data value that is to be compared with each sample of input data. If that value matches a predetermined portion of the sample of input data currently held by the data sampler 120, the data filter 130 captures that data sample, along with its associated time tag and overflow flag. Each time a sampled overflow flag is captured by the data filter 130, the data filter 130 causes the overflow flag in the time tag generator 110 to be reset. The functionality of the data filter 130 aids the user in capturing only data in which the user has particular interest. Selectively capturing the data in this fashion allows the user to ignore data that may otherwise obscure the actual data of interest.

Each newly captured sample of the input data, time tag, and overflow flag is then stored in a memory unit 140 for later use by the user. The data filter 130 initiates this event by forcing a valid flag to the memory unit 140 to become active. The data stored in memory unit 140 is then often displayed numerically or graphically to aid the user in determining the status of the captured data.

The overflow flags, as stored in the memory unit 140, provide a necessary indication as to how far the counter in the time tag generator 110 has progressed. For example, if one time tag in the memory unit 140 has a value N, and the following time tag has the value N+2, the overflow flag will indicate whether the second time tag is was actually captured only two time increments after the first, or whether the counter in the time tag generator 110 attained its maximum value and restarted at zero prior to reaching N+2. An active overflow flag associated with the second time tag would indicate that the second scenario applied in that case.

Unfortunately, such a scheme prevents detection of the scenario where the counter in the time tag generator 110 has overflowed more than once between captured data samples. In that instance, the samples of input data, time tags and overflow flags stored in the memory unit 140 will indicate that the counter will have overflowed only once, thereby allowing the time between the two input data samples to be miscalculated. An increase in the size of the counter employed in the time tag generator 110 may eliminate some instances of this occurrence, but such an enhancement is not a general purpose solution that is capable of dealing with arbitrary time intervals between captured input data samples.

Therefore, from the foregoing, a new data acquisition unit and method that allows for arbitrarily extensive delays between captured samples of input data would be advantageous.

SUMMARY OF THE INVENTION

Embodiments of the present invention, to be discussed in detail below, allow a data acquisition unit and method for properly tracking timing intervals between captured samples of input data that represent multiple overflows of a counter employed in a time tag generator. Instead of storing only captured input data samples, along with the timing information associated with that data sample, a special overflow state not specifically associated with a captured data sample is stored each time the counter has overflowed. As a result, embodiments of the present invention are capable of properly tracking an arbitrary number of overflows of the counter between consecutive captured input data samples, thereby eliminating the physical limitations of the time tag generator with essentially no impact on performance.

Other aspects and advantages of the invention will become apparent from the following detailed description, taken in conjunction with the accompanying drawings, illustrating by way of example the principles of the invention.

DETAILED DESCRIPTION OF THE PREFERRED EMBODIMENTS

Figure 2:
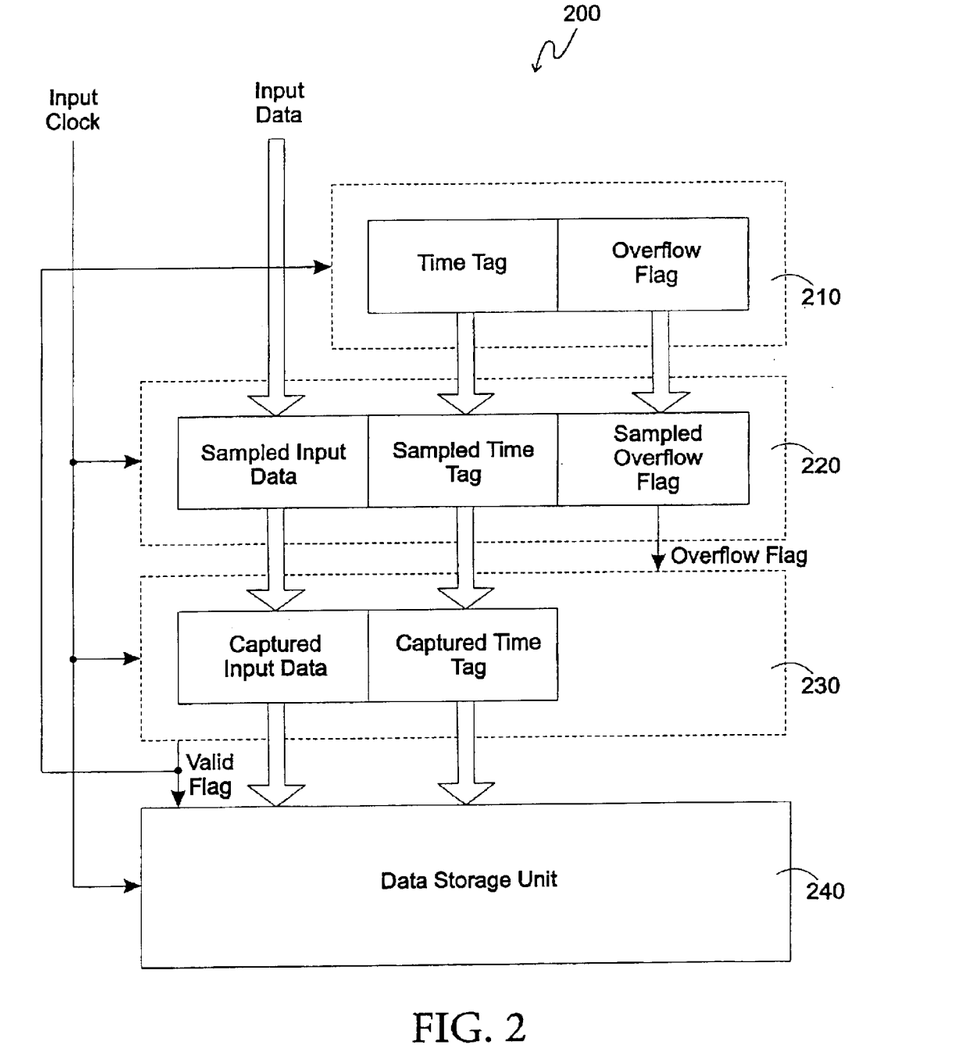
FIG. 2 is a block diagram of a data acquisition unit according to an embodiment of the invention that employs a primarily synchronous design, which is useful in cases where pulses of the input data clock occur at least once every overflow of a time tag generator.

A block diagram of one embodiment of the invention, a data acquisition unit 200, is shown in FIG. 2. A time tag generator 210 provides time tags and overflow flags in a similar fashion to the time tag generator 110 of FIG. 1. However, the overflow flags of the time tag generator 210 are only active temporarily so that an active overflow flag is sampled only once by the data sampler 220 of FIG. 2.

The data sampler 220, operating in somewhat the same manner as the data sampler 120 of FIG. 1, samples the input data, as well as the time tag and overflow flag from the time tag generator 210 at each pulse of the input clock.

As opposed to the data filter 130 of the prior art data acquisition unit 100 of FIG. 1, which essentially treats the sampled overflow flag from the data sampler 120 as raw data to be stored, the data filter 230 of FIG. 2 uses the overflow flag as an additional indication of whether to capture the current sample of the data sampler 220 for ultimate storage in a data storage unit 240, regardless of the value of the sample of the input data. As was the case in the prior art, if a predetermined portion of a sample of the input data held by the data sampler 220 matches a predetermined value, that data sample, along with its associated sampled time tag, are captured by the data filter 230. In addition, if the sampled overflow flag from the data sampler 120 is active, the data filter 230 captures the sample of input data and its associated time tag for later storage in the data storage unit 240, regardless of whether the predetermined portion of that data sample matches the predetermined value. In that case, that sample, as stored in the data storage unit 240, is an "overflow state," which indicates that an overflow of the time tag generator 210 occurred since the last captured sample was stored in the data storage unit 240. Thus, instead of storing a copy of the overflow flag for each captured sample that is stored in the data storage unit 240, a sample in the data storage unit 240 is used to denote an overflow, thus slightly reducing the amount of storage required for each captured sample of the input data. In the embodiment of FIG. 2, overflow states are stored along with the normally captured samples of input data because the valid flag becomes active when either the sampled overflow flag is active, or the sample of input data sufficiently matches the predetermined value used for capturing samples of the input data.

In the embodiment shown in FIG. 2, the valid flag, when active, also has the functionality of clearing out the overflow flag of the time tag generator 210. Alternately, the data sampler 220 may generate the required signal necessary to clear the overflow flag generated by time tag generator 210 when an active overflow flag has been sampled by the data sampler 220.

Using this approach, the data acquisition unit 200 is able to record the occurrence of multiple overflows of the time tag generator 210, thus keeping an accurate representation of the time elapsed between each consecutive captured sample of input data that is stored in the data storage unit 240. Additionally, this advance is accomplished while maintaining an essentially synchronous design for the data filter 230, as the timing for that unit is driven by the input clock associated with the input data being sampled.

Although the input clock is generally thought to be an external clock source associated directly with the input data, the input clock may also be generated internal to a device in which the data acquisition unit 200 resides, such as a logic analyzer. Furthermore, the clock driving the time tag generator 210 is typically generated internal to the time tag generator 210, but could also be generated external to the data acquisition unit 200 in some embodiments. In addition, the data storage unit 240 of some embodiments may be driven by a free-running clock that is completely separate from the input clock that drives the data sampler 220 and the data filter 230.

Figure 3:
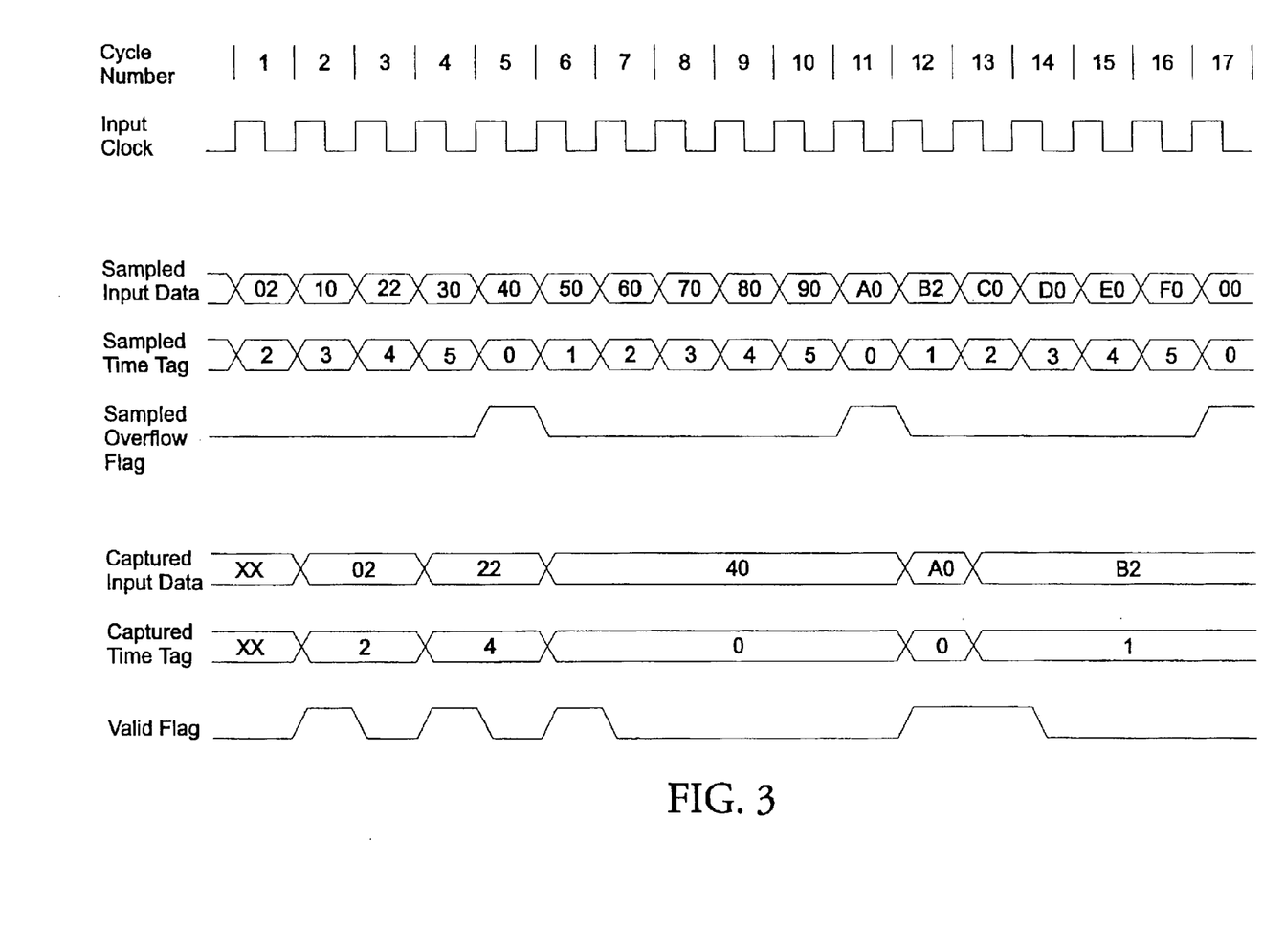
FIG. 3 is a timing diagram of a typical operation of the data acquisition unit of FIG. 2.

To further describe the operation of the data acquisition unit 200, a timing diagram is presented in FIG. 3. At the top of the diagram is shown the input clock. Associated with each period of the input clock is a cycle number that is used merely for purposes of demonstration in the diagram.

Next are the sampled input data, time tag, and overflow flag at the output of the data sampler 220 for each period of the input clock. The data sample values shown are 8-bit values shown in hexadecimal format. Of course, input data of greater or narrower width could also be processed by embodiments of the invention. The sampled time tag values, as shown, are normalized to the input clock time domain to simplify the discussion. Embodiments of the present invention may store the time tags in the data storage unit 240 in this fashion, or the raw values of the time generator 210 may be saved. The overflow flag, as shown, is an active HIGH signal, although other embodiments of the invention may use a different polarity for that signal.

Below the sampled signals are the valid flag generated by the data filter 230 and the captured samples of input data and time tags to be stored in the data storage unit 240.

In the scenario depicted in FIG. 3, the data filter 230 is programmed to check for a predetermined data value of X2, in each sample of the input data from the data sampler 220. In other words, if the lower four bits of a sample of the input data equal the hexadecimal value 2, or 0010 in binary format, that sample will be captured by the data filter 230 for subsequent storing in the data storage unit 240. The upper four bits can be any value, as denoted by the 'X' in X2.

As seen in FIG. 3, the first data sample matching the predetermined data value is the 02 input data of cycle 1. The cycle after the data sampler 220 samples that data, the data filter 230 captures that sample of the input data, along with the associated time tag of 2. During that same cycle, the valid flag becomes active temporarily so that the data storage unit 240 will store those samples of the input data and the time tag internally for later retrieval.

Two clock cycles later, another data pattern (22, sampled during cycle 3) is captured by the data filter 230, as that pattern also matches the predetermined data value that the data filter 230 employs to capture select data samples.

Two more clock cycles later, at cycle 5, the time tag value from the time tag generator 210 overflows, progressing from a value of 5 to 0. As a result, the overflow flag from the time tag generator 210 becomes active. In other embodiments of the present invention, the overflow flag may become active at some other point, such as when the time tag generator produces its maximum value just prior to beginning a new at zero. In response, the data filter 230 captures the sample of the input data (40) and its associated time tag (0), even though the sampled data value does not match the predetermined data value. Alternately, in other embodiments, the actual input data and time tag sampled by the data sampler 220 in that case may not be captured by the data filter 230, as the actual values are not particularly critical when an overflow state is captured. Additionally, the active state of the overflow flag causes the valid flag from the data filter 230 to become active, indicating to the data storage unit 240 that the captured sample is to be stored. Also, as a result of the valid flag becoming active, the overflow flag of the time tag generator 210 is cleared.

No matching sampled data values are encountered for several input clock cycles, during which another overflow state, occurring at cycle 11, occurs. The cycle immediately thereafter, a sample of input data (B2) matching the predetermined criteria is present. As a result, both the overflow state and a captured input data sample are recorded during consecutive input clocks into the data storage unit 240. In that situation, the valid flag generated by the data filter 230 is active for two consecutive input clock cycles.

When the data stored in the data storage unit 230 is eventually retrieved for numerical or graphical display, the overflow states are identified by whether the values of the captured data samples match the capturing criteria. If the value of a sample of the input data does not match the predetermined value used by the data filter 230, the entry denotes an overflow state, and the timing between the captured data samples coming before and after that overflow state is adjusted accordingly.

One potential circumstance not handled by either the prior art data acquisition unit 100 or the acquisition unit 200 is an input clock with a frequency that is less than the rate at which the time tag generator 210 overflows. Since the data filter 230 of FIG. 2 is driven synchronously by the input clock, the possibility exists that the overflow flag generated by the time tag generator 210 will become active twice within consecutive pulses of the input clock. In such a case, only one of the two instances of the overflow flag becoming active will be captured as an overflow state by the data filter 230. Therefore, the data recorded in the data storage unit 240 does not accurately reflect the timing of the input data samples captured.

Figure 4:
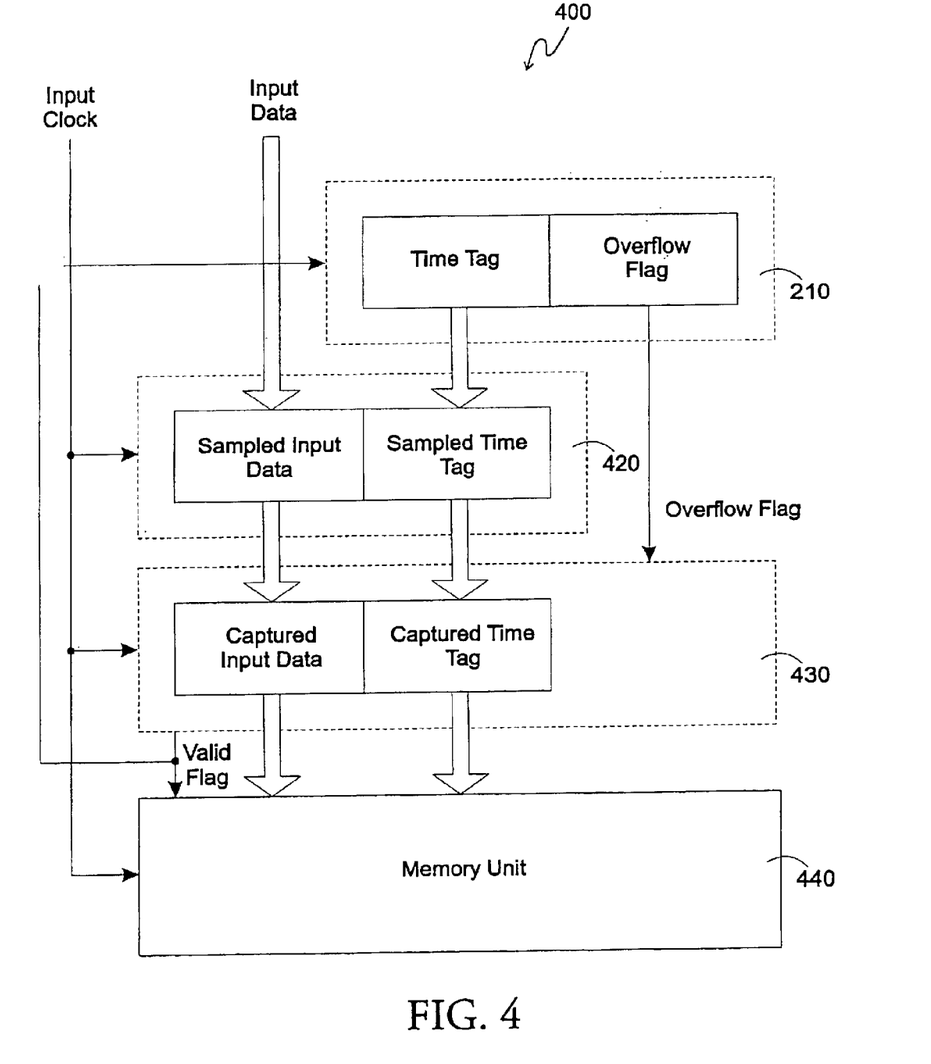
FIG. 4 is a block diagram of a data acquisition unit according to an embodiment of the invention that utilizes asynchronous design, which is useful in cases where pulses of the input clock do not always occur once per overflow of the time tag generator.

To handle this particular situation, another embodiment of the invention, data acquisition unit 400, as shown in FIG. 4, may be employed. In this case, a data sampler 420 samples the input data and the time tag from the time tag generator 210, but the data sampler does not sample the overflow flag. Instead, a data filter 430 takes the signal directly from the time tag generator 210, asynchronous to the input clock. Upon the overflow flag becoming active, the data filter 430 activates the valid flag, thereby causing a data storage unit 240 to store an overflow state. Since the overflow flag is causing action asynchronous to the input clock, some additional circuitry is employed for the data filter 430 and the data storage unit 440 not required by the data filter 230 and the data storage unit 240 of FIG. 2 to ensure that any data hazard or race conditions do not occur.

In a fashion analogous to the data acquisition unit 200 of FIG. 2, alternate embodiments of the data acquisition unit 400 may use a slightly different clocking arrangement than that shown in FIG. 4. For example, the input clock may be generated internal to a device in which the data acquisition unit 400 resides, such as a logic analyzer. Also, the clock driving the time tag generator 210 is typically generated internal to the time tag generator 210, but could also be generated external to the data acquisition unit 400 in some embodiments. Furthermore, the data storage unit 440 of some embodiments may be driven by a free-running clock that is completely separate from the input clock that drives the data sampler 420 and the data filter 430.

Figure 5:
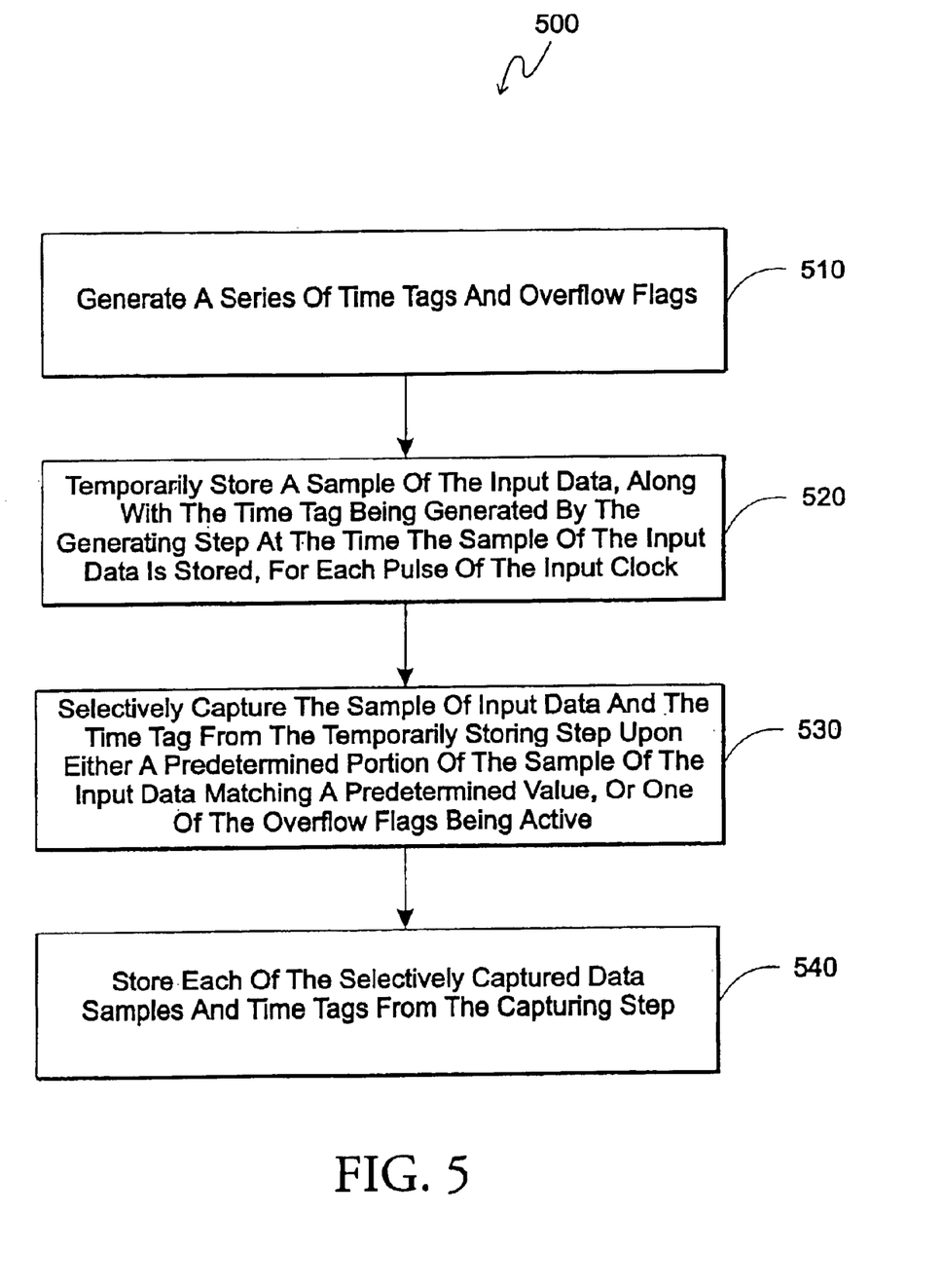
FIG. 5 is a flowchart showing a method of capturing input data and associated timing information according to an embodiment of the invention.

Embodiments of the present invention may also take the form of a method 500 of capturing samples of input data with associated timing information without requiring storage of an overflow flag with each sample of input data captured. As shown in FIG. 5, method 500 begins with the generation of a series of time tags and overflow flags (step 510). The overflow flags become active whenever the series of time tags restarts from some initial value. While the time tags and overflow flags are being generated, a sample of the input data is temporarily stored for each pulse of an input clock, along with the time tag being generated by the generating step at that time (step 520). These samples of input data and timing data are then selectively captured upon either a predetermined portion of the sample of the input data matching a predetermined value, or upon the one of the overflow flags being active (step 530). Each of the selectively captured samples of the input data and the time tags are then stored (step 540).

From the foregoing, the embodiments of the invention discussed above have been shown to provide a data acquisition unit and method of capturing infrequent samples of input data while maintaining accurate timing information. In addition, other specific units and methods embodying the invention are also possible. Therefore, the present invention is not to be limited to the specific forms so described and illustrated; the invention is limited only by the claims.

What is claimed is:

1. A data acquisition unit for storing input data and time tags as sampled by way of an input clock, the data acquisition unit comprising:

a time tag generator configured to generate a series of time tags and overflow flags, the overflow flags indicating when the series of time tags restart from an initial value;

a data sampler configured to temporarily store a sample of the input data, along with the time tag being generated by the time tag generator at the time the sample of the input data is stored, for each pulse of the input clock;

a data filter configured to selectively capture the sample of the input data and the time tag from the data sampler upon either a predetermined portion of the sample of the input data matching a predetermined value, or one of the overflow flags being active; and a data storage unit configured to store each of the selectively captured samples of the input data and the time tags from the data filter.

2. The data acquisition unit of claim 1, wherein the data sampler also temporarily stores the overflow flag being generated by the time tag generator at the time the sample of the input data is stored, the data filter synchronously utilizing the overflow flag that is stored by the data sampler at each pulse of the input clock.

3. The data acquisition unit of claim 1, wherein the data filter asynchronously utilizes the overflow flags directly from the time tag generator.

4. The data acquisition unit of claim 1, wherein at least one of the overflow flags becomes active when one of the time tags generated by the time tag generator attains a maximum possible value.

5. The data acquisition unit of claim 1, wherein at least one of the overflow flags becomes active when one of the time tags generated by the time tag generator is zero.

6. A data acquisition unit for storing input data and time tags as sampled by way of an input clock, the data acquisition unit comprising:

means for generating a series of time tags and overflow flags, the overflow flags indicating when the series of time tags restart from an initial value;

means for temporarily storing a sample of the input data, along with the time tag being generated by the generating means at the time the sample of the input data is stored, for each pulse of the input clock;

means for selectively capturing the sample of the input data and the time tag from the temporarily storing means upon either a predetermined portion of the sample of the input data matching a predetermined value, or one of the overflow flags being active and means for storing each of the selectively captured samples of the input data and the time tags from the capturing means.

7. The data acquisition unit of claim 6, wherein the temporarily storing means also temporarily stores the overflow flag being generated by the generating means at the time the sample of the input data is stored, the capturing means synchronously utilizing the overflow flag that is stored by the temporarily storing means at each pulse of the input clock.

8. The data acquisition unit of claim 6, wherein the capturing means asynchronously utilizes the overflow flags directly from the generating means.

9. The data acquisition unit of claim 6, wherein at least one of the overflow flags becomes active when one of the time tags generated by the generating means attains a maximum possible value.

10. The data acquisition unit of claim 6, wherein at least one of the overflow flags becomes active when one of the time tags generated by the generating means is zero.

11. A method of storing input data and time tags as sampled by way of an input clock, the method comprising the steps of:

generating a series of time tags and overflow flags, the overflow flags indicating when the series of time tags restart from an initial value;

temporarily storing a sample of the input data, along with the time tag being generated by the generating step at the time the sample of the input data is stored, for each pulse of the input clock;

selectively capturing the sample of the input data and the time tag from the temporarily storing step upon either a predetermined portion of the sample of the input data matching a predetermined value, or one of the overflow flags being active; and storing each of the selectively captured samples of the input data and time tags from the capturing step.

12. The method of claim 11, wherein the temporarily storing step also temporarily stores the overflow flag being generated by the generating step at the time the sample of the input data is stored, the capturing step synchronously utilizing the overflow flag that is stored by the temporarily storage step at each pulse of the input clock.

13. The method of claim 11, wherein the capturing step asynchronously utilizes the overflow flags directly from the generating step.

14. The method of claim 11, wherein at least one of the overflow flags becomes active when one of the time tags generated by the generating step attains a maximum possible value.

15. The method of claim 11, wherein at least one of the overflow flags becomes active when one of the time tags generated by the generating step is zero.

* * * * *

UNITED STATES PATENT AND TRADEMARK OFFICE
CERTIFICATE OF CORRECTION

PATENT NO. : 6,741,953 B2
DATED : May 25, 2004
INVENTOR(S) : Adrian M. Hernandez, John David Hansen and John J. Sinnott It is certified that error appears in the above-identified patent and that said Letters Patent is hereby corrected as shown below:

Column 8,
Line 12, before "step", delete "storage" and insert therefor -- storing --

Signed and Sealed this

Seventh Day of December, 2004

JON W. DUDAS
*Director of the United States Patent and Trademark Office*